United States Patent
Hwang et al.

(10) Patent No.: US 10,535,406 B2
(45) Date of Patent: Jan. 14, 2020

(54) STORAGE DEVICE AND COPY-BACK METHOD THEREOF

(71) Applicant: Samsung Electronics Co., Ltd., Suwon-si (KR)

(72) Inventors: Intae Hwang, Hwaseong-si (KR); Jinwan Jun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 213 days.

(21) Appl. No.: 15/615,043

(22) Filed: Jun. 6, 2017

(65) Prior Publication Data

US 2018/0061494 A1    Mar. 1, 2018

(30) Foreign Application Priority Data

Sep. 1, 2016  (KR) .................. 10-2016-0112733

(51) Int. Cl.
*G11C 29/00* (2006.01)
*G11C 16/10* (2006.01)
*G06F 11/07* (2006.01)
*G11C 29/52* (2006.01)

(52) U.S. Cl.
CPC ........ *G11C 16/105* (2013.01); *G06F 11/0706* (2013.01); *G11C 29/52* (2013.01)

(58) Field of Classification Search
CPC ... G11C 16/105; G11C 11/5642; G11C 29/42; G11C 29/44; G11C 29/52; G06F 11/0706; G06F 11/1068
USPC ....... 714/719, 718, 721, 745, 704, 708, 817, 714/818
See application file for complete search history.

(56) References Cited

U.S. PATENT DOCUMENTS

| | | | |
|---|---|---|---|
| 7,295,470 B2 | 11/2007 | Park et al. | |
| 7,679,133 B2 | 3/2010 | Son et al. | |
| 8,072,817 B2 | 12/2011 | Guterman et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,909,982 B2 | 12/2014 | Weston-Lewis et al. | |
| 8,914,703 B2 | 12/2014 | Tomlin | |
| 8,996,959 B2 * | 3/2015 | Jung ................. | G06F 11/10 714/718 |
| 9,230,669 B2 | 1/2016 | Jung et al. | |
| 9,619,321 B1 * | 4/2017 | Haratsch ............ | G06F 11/1008 |
| 2011/0233648 A1 | 9/2011 | Seol et al. | |
| 2015/0006792 A1 | 1/2015 | Lee et al. | |
| 2015/0380111 A1 * | 12/2015 | Rao Subbu ........... | G11C 29/52 714/763 |
| 2016/0188462 A1 | 6/2016 | Shin et al. | |

FOREIGN PATENT DOCUMENTS

| KR | 20130076430 | 7/2013 |
|---|---|---|
| KR | 101548689 | 9/2015 |

* cited by examiner

*Primary Examiner* — Christine T. Tu
(74) *Attorney, Agent, or Firm* — Onello & Mello, LLP

(57) ABSTRACT

A copy-back method of a storage device includes reading a memory data from a source area of the storage device. A number of error bits of the memory data is determined. An inspection read operation is performed if the number of error bits exceeds a reference value. The memory data is written to a destination area of the storage device if the number of error bits does not exceed the reference value.

20 Claims, 13 Drawing Sheets

① → ④ : Internal Copy-back
① → ② → ③ → ④ : External Copy-back

STORAGE DEVICE AND COPY-BACK METHOD THEREOF

CROSS-REFERENCE TO RELATED APPLICATION

This application claims priority under 35 U.S.C. § 119 to Korean Patent Application No. 10-2016-0112733, filed on Sep. 1, 2016, the disclosure of which is hereby incorporated by reference in its entirety.

BACKGROUND

Semiconductor memory devices are classified into volatile semiconductor memory devices and nonvolatile semiconductor memory devices. The read and write speeds of the volatile memory device are fast, but when a power supply is interrupted, data stored therein disappears. In contrast, the data content of a nonvolatile semiconductor memory device does not disappear when the power supply is interrupted. Therefore, the nonvolatile semiconductor memory device retains the data content regardless of whether a power supply is supplied or not.

The nonvolatile semiconductor memory device typically includes a flash memory device. The flash memory device is being used as a voice and image data storage medium of information devices such as a computer, a cellular phone, a smartphone, a personal digital assistant (PDA), a digital camera, a camcorder, a voice recorder, an MP3 player, a handheld PC, a game console, a facsimile, a scanner, and a printer. Technologies for high-capacity, high-speed input/output, and low-power nonvolatile memory devices are being developed to mount the nonvolatile memory device in mobile devices including a smartphone.

Regarding the nonvolatile memory device, a copy-back operation is performed to copy data of any one source area back to a destination area. When an error is detected from data of the source area during the copy-back operation, a method corrects the detected error and writes the error-corrected data in the destination area. However, the copy-back operation accompanying the error correction operation increases the time needed to perform the copy-back operation, thus reducing the access performance.

SUMMARY

In one aspect, the present inventive concepts are directed to a copy-back method of a nonvolatile memory device comprising reading a source data from a source area of the nonvolatile memory. A number of error bits of the source data is detected. An inspection read operation is performed when the number of error bits of the source data exceeds a reference value, the inspection read operation including reading a plurality of read sampling data from the source area by using a respective sampling read voltages and detecting the number of error bits of each of the read sampling data. A determination is made based on the inspection read operation, whether to copy back the source data to a destination area using an internal copy-back method, which does not comprise an error correction operation, or whether to copy back the source data using an external copy-back method, which comprises an error correction operation. The internal copy-back method is determined to be used when a number of detected error bits of the read sampling data is not more than the reference value.

In another aspect, the present inventive concepts are directed to a storage device comprising a nonvolatile memory device configured to sense a source data from a source area of the storage device, to store the source data in a page buffer, and to write the source data stored in the page buffer to a destination area in response to a command. A memory controller is configured to detect a number of error bits of the source data and to perform an inspection read operation on a plurality of read sampling data in the source area to determine if a number of error bits detected for each of the read sampling data exceeds a reference value during a copy-back operation. The inspection read operation includes reading each of the read sampling data from the source area by using a respective sampling read voltage, and detecting the number of error bits for each of the read sampling data.

In another aspect, the present inventive concepts are directed to a copy-back method of a storage device comprising reading a memory data from a source area of the storage device. A number of error bits of the memory data is determined. An inspection read operation is performed if the number of error bits exceeds a reference value. The memory data is written to a destination area of the storage device if the number of error bits does not exceed the reference value.

BRIEF DESCRIPTION OF THE DRAWINGS

These and/or other aspects and advantages of the present general inventive concepts will become apparent and more readily appreciated from the following description of the embodiments, taken in conjunction with the accompanying drawings of which.

DETAILED DESCRIPTION OF THE EMBODIMENTS

Figure 1:
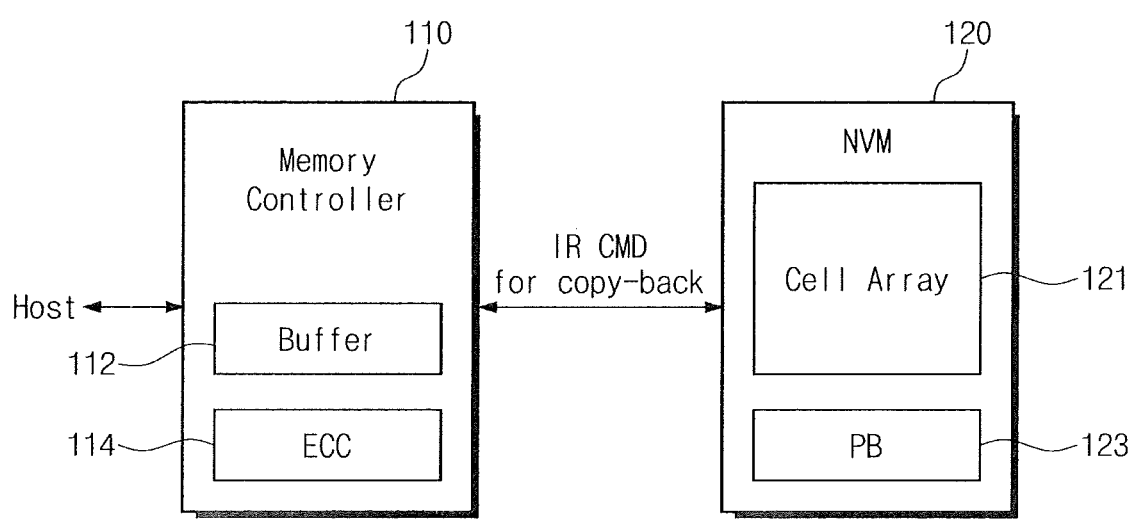
FIG. 1 is a functional block diagram of a storage device, in accordance with an embodiment of the present disclosure.

Reference will now be made in detail to the embodiments of the present general inventive concepts, examples of which are illustrated in the accompanying drawings, wherein like reference numerals refer to the like elements throughout. The embodiments are described below in order to explain the present general inventive concepts by referring to the figures.

Below, a NAND-type flash memory device may be used as an example of a nonvolatile memory device for describing features and functions of the inventive concept. However, one skilled in the art may easily understand other features and performances from information disclosed herein. For example, a technology according to an embodiment of the inventive concept may be used in a phase-change random access memory (PRAM), a magnetoresistive RAM (MRAM), a resistive RAM (ReRAM), a ferroelectric RAM (FRAM), a NOR flash memory, etc.

Embodiments of the inventive concept described herein relate to a semiconductor memory device, and more particularly, to a storage device that performs correction of a read voltage in a copy-back operation and a copy-back method thereof. Advantageously, the storage device reduces performance degradation resulting from a copy-back operation and a copy-back method thereof.

FIG. 1 is a functional block diagram of a storage device in accordance with an embodiment of the present disclosure. Referring to FIG. 1, a storage device 100 may include a memory controller 110 and a nonvolatile memory device 120. The memory controller 110 may perform various memory management operations such as a garbage collection operation and a merge operation, during which, a request for the copy-back operation may be generated. The memory controller 110 may provide a command for the copy-back operation to the nonvolatile memory device 120.

The memory controller 110 controls the nonvolatile memory device 120 in response to a request from a host. The memory controller 110 may provide a write command or write data to the nonvolatile memory device 120 in response to a write request from the host. When receiving a read request from the host, the memory controller 110 may control the nonvolatile memory device 120 to sense and output data of a corresponding address.

In particular, the memory controller 110 may provide an inspection read command IR CMD to the nonvolatile memory device 120 in the copy-back operation. The inspection read command (IR CMD) is provided when error bits, the number of which is greater than a reference value TH, are detected from source data in the copy-back operation. Specifically, the memory controller 110 may detect whether the source data is correctable, through adjusting a read voltage before the error of the source data is corrected. For the detection operation, the memory controller 110 may transfer the inspection read command IR CMD to the nonvolatile memory device 120.

In response to the inspection read command IR CMD, the nonvolatile memory device 120 may transfer pieces of data sampled from the source area to the memory controller 110. The pieces of sampling data are pieces of data that are subsequently sensed by respective sampling read voltages for detecting a changed distribution valley of the source area. The memory controller 110 performs error detection on each of the pieces of sampling data. The memory controller 110 may select a read voltage corresponding to the minimum number of error bits as an optimum read voltage Vrd_opt. Internal copy-back is possible when the number of error bits of data read by the optimum read voltage Vrd_opt is not more than the reference value TH. However, the memory controller 110 may perform external copy-back when the number of error bits of data read by the optimum read voltage Vrd_opt is greater than the reference value TH.

The memory controller 110 may include an ECC block 114 that detects errors of pieces of the sampling data. The memory controller 110 may further include a buffer 112 that is provided as a buffer memory for the external copy-back. The ECC circuit 114 may detect an error of data read from the nonvolatile memory device 120 in units of "codewords." The ECC block 114 may correct an error of data stored in the buffer 112. The ECC block 114 may use various error detection and correction codes including, but not limited to, low density parity check (LDPC), turbo code, and Bose-Chaudhuri Hocquenghem (BCH) code.

The nonvolatile memory device 120 may include one or more memory devices. The nonvolatile memory device 120 may perform the copy-back operation under control of the memory controller 110. The nonvolatile memory device 120 may sense memory cells of a selected source area (e.g., a page area) by using different sampling read voltages SRi ("i" being an integer of 0 or more) in response to the inspection read command IR CMD. The nonvolatile memory device 120 may provide the sensed sampling data to the memory controller 110. Accordingly, the nonvolatile memory device 120 may include a cell array 121 and a page buffer 123. A sampling read operation that is performed in response to the inspection read command IR CMD will be more fully described with reference to accompanying drawings.

According to an embodiment of the present disclosure, errors that exist in source areas of the nonvolatile memory device 120 may include an error that is correctable by adjusting a read voltage without the need for an error correction operation. In the copy-back operation, the likelihood of having to execute the external copy-back, (in which the utilization rate of a resource such as a channel or a buffer capacity is high), may be markedly reduced by using the above-described method of correcting an error, without using the ECC 114.

Figure 2:
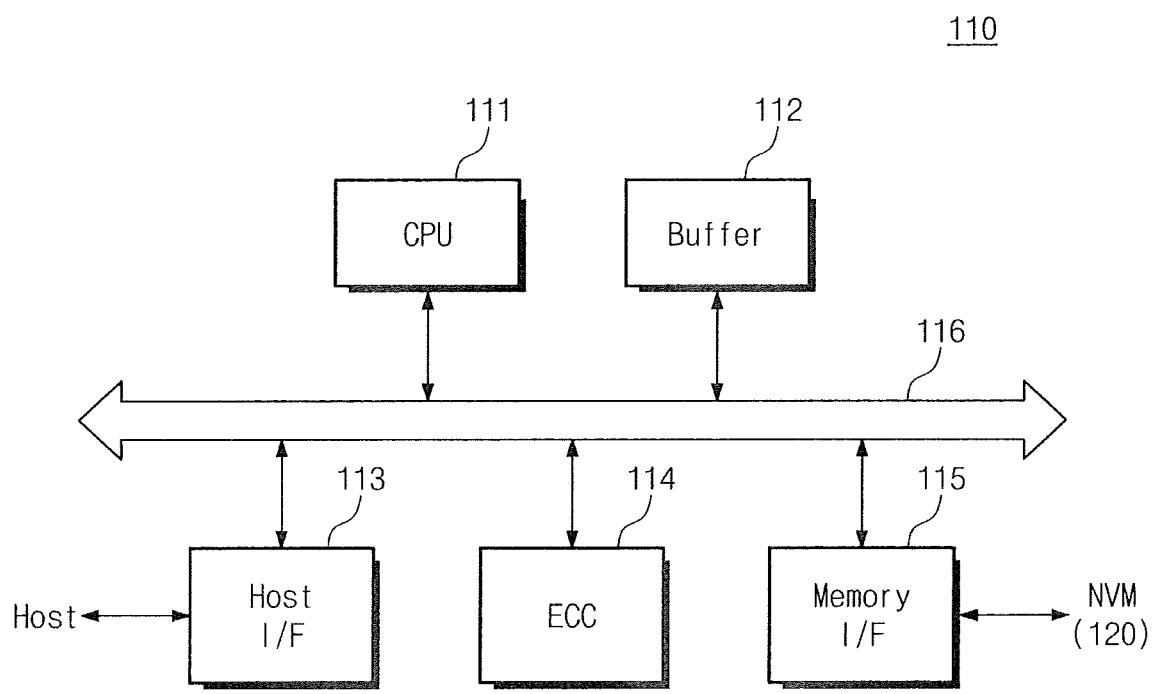
FIG. 2 is a functional block diagram of a configuration of an embodiment of the memory controller of FIG. 1.

FIG. 2 is a functional block diagram of a configuration of an embodiment of the memory controller of FIG. 1. Referring to FIG. 2, the memory controller 110 includes a central processing unit (CPU) 111, a buffer 112, a host interface 113, the ECC block 114, and a memory interface 115, each of which share a common bus 116 for communication.

The CPU 111 may transfer a variety of control information, which is needed to perform a read/write operation on the nonvolatile memory devices 120 (refer to FIG. 1), to the host interface 113 and the memory interface 115. The CPU 111 may operate based on firmware, which is provided for various control operations of the memory controller 110. For example, the CPU 111 may execute a flash translation layer (FTL) for performing garbage collection for managing the nonvolatile memory device 120, address mapping, wear leveling and other related operations.

The buffer 112 may be used as a buffer memory of the memory controller 110. For example, data that is "write-requested" from the host may be transmitted to the nonvolatile memory device 120 after being stored in the buffer 112. In addition, data read from the nonvolatile memory device 120 may be transferred to the host after being stored in the buffer 112. In the copy-back operation, source data may be stored in the buffer 112. In particular, in the external copy-back operation, an error of the source data stored in the buffer 112 may be corrected by the ECC block 114. The error-corrected source data may be written in the destination area after being transferred to the nonvolatile memory device 120 again.

The host interface 113 may communicate with the host. For example, the host interface 113 may provide a channel for communication with the host. The host interface 113 may provide a physical connection between the host and the storage device 100. That is, the host interface 113 may interface with the storage device 100 in compliance with the bus format of the host. The bus format of the host may include at least one of a universal serial bus (USB), a small computer system interface (SCSI), a peripheral component interconnect Bus (PCI) express, advanced technology attachment (ATA), a parallel ATA (PATA), a serial ATA (SATA), serial attached SCSI (SAS), and universal flash storage (UFS).

The ECC block 114 may perform encoding for error detection and correction on write-requested data. The ECC block 114 may detect an error included in data that are read from the nonvolatile memory device 120 and may correct the detected error. In particular, during the copy-back operation according to an embodiment, the ECC block 114 may detect the number of error bits of the source data. The memory controller 110 may determine a way to copy back source data, based on the number of error bits detected by the ECC block 114.

When the number of error bits included in the source data is less than or equal to the reference value TH, the memory controller 110 may select the internal copy-back as a copy-back method. In contrast, when the number of error bits included in source data is greater than the reference value TH, the memory controller 110 may then detect the optimum read voltage Vrd_opt by using the inspection read command IR CMD according to one embodiment. After a read operation is performed again on the source area by using the detected optimum read voltage Vrd_opt, the number of error bits may be again detected by the ECC block 114. If the number of detected error bits is not more than the reference value TH, the internal copy-back operation may be performed on the source data. In contrast, if the number of detected error bits is greater than the reference value TH, the external copy-back may be chosen as the method to copy back the source data, and an error correction operation may be performed by the ECC block 114.

The memory interface 115 may exchange data with the nonvolatile memory device 120. The memory interface 115 may transfer data transferred from the buffer 112 to the nonvolatile memory device 120 through a memory channel(s). Read data, which is provided from the nonvolatile memory device 120 through the memory channel, may be collected by the memory interface 115. The collected data may be stored in the buffer 112.

The memory controller 110 may determine whether to perform the internal copy-back or the external copy-back based on the number of error bits included in source data in the copy-back operation. Specifically, when the number of error bits included in the source data is greater than the reference value TH, the memory controller 110 may detect the optimum read voltage Vrd_opt by using the inspection read command IR CMD before the external copy-back is performed. The memory controller 110 may again detect the number of error bits included in source data that are read by using the optimum read voltage Vrd_opt and may finally determine whether to use the internal copy-back or the external copy-back based on the detection result. Since the number of error bits included in the source data that are read by using the optimum read voltage Vrd_opt is sharply reduced, the probability that the external copy-back will be performed may be markedly lowered.

Figure 3:
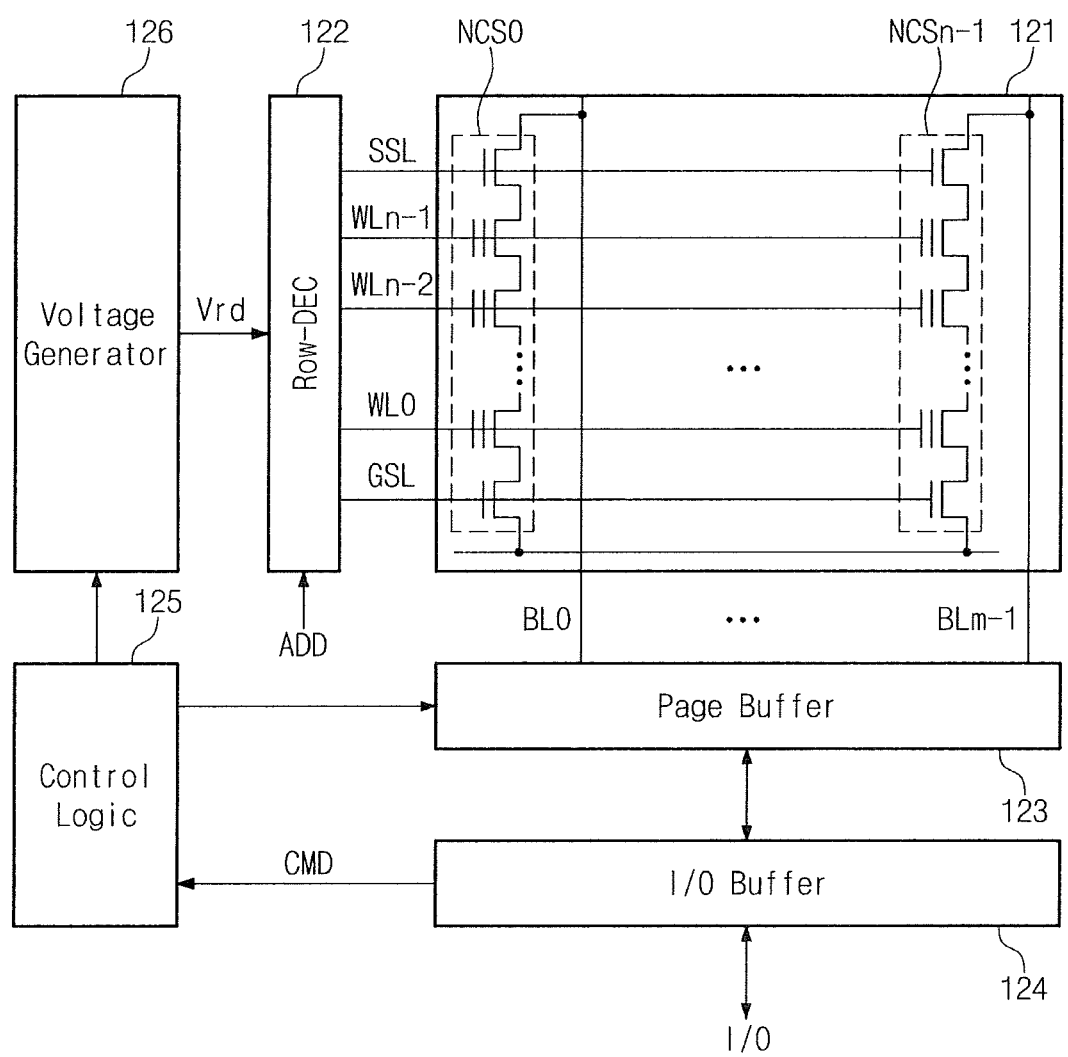
FIG. 3 is a functional block diagram of the nonvolatile memory device of FIG. 1.

FIG. 3 is a functional block diagram of the nonvolatile memory device of FIG. 1. Referring to FIG. 3, the nonvolatile memory device 120 may include a memory cell array 121, a row decoder 122, a page buffer 123, an input/output buffer 124, control logic 125, and a voltage generator 126.

The cell array 121 is connected to the row decoder 122 through word lines and selection lines SSL and GSL. The cell array 121 is connected to the page buffer 123 through bit lines BL0 to BLm−1. The cell array 121 includes a plurality of cell strings NCS0 to NCSm−1 formed in a NAND type arrangement. The cell strings NCS0 to NCSm−1 may constitute a memory block BLK. Here, a channel of each cell string may be formed in a direction that is perpendicular or parallel to a substrate upon which the NVM 120 is fabricated.

In an embodiment, the cell array 121 may be implemented with a three dimensional (3D) memory array. The 3-D memory array may be monolithically formed in one or more physical level(s) of a memory cell array having an active area arranged in a circuit formed on a silicon substrate. The circuit formed to operate the memory cells may be located in a substrate or on a substrate. The term "monolithic" means that layers of each level of the array are directly deposited on the layers of each underlying level of the array.

In an embodiment of the inventive concept, the 3D memory array includes vertical NAND strings that are vertically oriented such that at least one memory cell is located over another memory cell. The at least one memory cell may comprise a charge trap layer. Each vertical NAND string may include at least one selection transistor located over memory cells. At least one selection transistor may have the same structure as those of memory cells and may be monolithically formed together with memory cells.

The following patent documents, which are hereby incorporated by reference, describe suitable configurations for three-dimensional memory arrays, in which the three-dimensional memory array is configured with a plurality of levels, with word lines and/or bit lines shared between levels: U.S. Pat. Nos. 7,679,133; 8,553,466; 8,654,587; 8,559,235; and U.S. Pat. Pub. No. 2011/0233648.

During a program operation, memory cells may be selected in a unit (e.g., 2 KB) equal in size to a page or in a unit (e.g., 512 B) smaller in size than a page by controlling the word lines or the selection lines SSL and GSL. In one embodiment, the GSL line may refer to a global select line, while the SSL line is a local (or segment) select line, arranged to provide hierarchy or word line selection. Similarly, during a read operation, memory cells may be selected in the unit equal in size to a page or in the unit smaller in size than a page. For various reasons, a threshold voltage distribution of memory cells during a read operation may be different than during a program operation. Accordingly, to improve data integrity, a level of a read voltage may be adjusted to compensate for a change in a threshold voltage.

The row decoder 122 may select one of memory blocks of the cell array 121 in response to an address ADD. The row decoder 122 may select one of word lines of the selected memory block. The row decoder 122 may transfer a read voltage Vrd from the voltage generator 126 to the selected word line. During the program operation, the row decoder 122 may transfer a program voltage and a verification voltage to a selected word line and a pass voltage to an unselected word line. During the read operation, the row decoder 122 may transfer a selection read voltage Vrd to a selected word line and a non-selection read voltage Vread to an unselected word line.

The page buffer 123 may operate as a write driver in the program operation and as a sense amplifier in the read operation. During the program operation, the page buffer 123 may transfer a bit line voltage corresponding to to-be-programmed data to a bit line of the cell array 121. During the read operation, the page buffer 123 may sense data stored in a selected memory cell through a bit line. The page buffer 123 may latch the sensed data and may output the latched data to the input/output buffer 124.

The page buffer 123 senses and stores data from a source area during the copy-back operation. The page buffer 123 may write source data, which is read from the source area, in another memory area, (e.g. the destination area). In particular, during the internal copy-back operation, source data latched in the page buffer 123 may be copied to the destination area without outputting the source data outside of the NVM 120, and thereby not incurring bus activity on 116 or consuming resources in the memory interface 115.

In contrast, source data latched in the page buffer 123 is stored in the buffer 112 of the memory controller 110 for the external copy-back. The source data stored in the buffer 112 may be subsequently provided to the page buffer 123 after error correction decoding is performed thereon. Afterwards, the page buffer 123 may program the error-corrected source data in the destination area.

During the read operation, the input/output buffer 124 may output data latched in the page buffer 123 outside the NVM 120 in I/O units. During the program operation, the input/output buffer 124 may transfer data provided from outside the NVM 120 to the page buffer 123 for programming into the cell array 121. The input/output buffer 124 may transfer a received address ADD or command CMDi to the row decoder 122 or the control logic 125.

The control logic 125 may control the row decoder 122 and the page buffer 123 in response to a command CMD received through the I/O buffer 124. The control logic 125 may control the page buffer 123 and the voltage generator 126 in response to the inspection read command IR CMD from the memory controller 110, to allow selected memory cells to be sensed by using a specified read voltage. For example, the control logic 125 may control the page buffer 123 and the voltage generator 126, such that selected memory cells are sensed by using read voltages SRi that are selected through the inspection read command IR CMD. Data that are read through a plurality of inspection read operations are provided to the memory controller 110 after being stored in the page buffer 123.

The voltage generator 126 may generate various word line voltages to be supplied to the word lines and a voltage that is supplied to a bulk (e.g., a well area) in which memory cells are framed, under control of the control logic 125. The word line voltages to be supplied to the word lines may include a program voltage Vpgm, a pass voltage Vpass, a selection read voltage Vrd, and a non-selection read voltage Vread. During the inspection read operation, the voltage generator 126 may generate read voltages and may provide the sampling read voltages SRi to the row decoder 122.

The nonvolatile memory device 120 according to an embodiment of the inventive concept may output sampling data, which are sensed by using the sampling read voltages SRI, in response to the inspection read command IR CMD from the memory controller 110. On the basis of the sampling data output in response to the inspection read command IR CMD, the memory controller 110 may again read source data and may determine a copy-back mode corresponding to either the internal copy-back or the external copy-back based on the read result.

Figure 4:
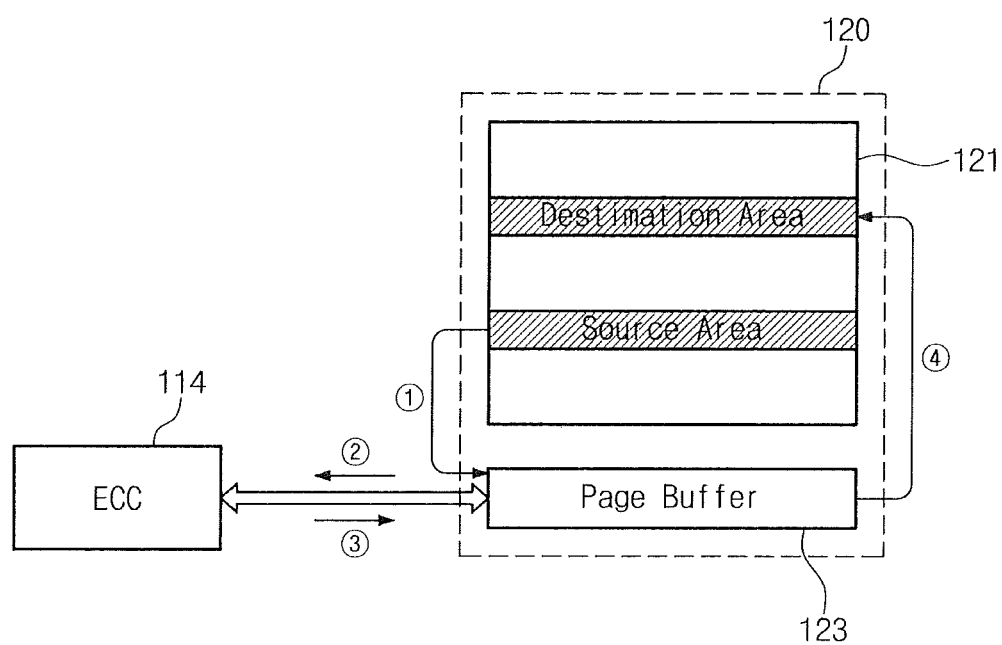
FIG. 4 is a functional block diagram describing a copy-back operation, in accordance with an embodiment of the present disclosure.

FIG. 4 is a functional block diagram describing a copy-back operation, in accordance with an embodiment of the present disclosure. The internal copy-back and the external copy-back according to an embodiment of the inventive concept will be conceptually described with reference to FIG. 4.

All copy-back operations begin with sensing and latching data stored in a source area of the cell array 121. A encircled number 1, 2, 3 or 4 ("①", "②", "③", or "④" respectively) of FIG. 4 indicates the process being performed. Source data read from the source area may be stored in the page buffer 123 at ①. The source data stored in the page buffer 123 may then be programmed in a destination area by the page buffer 123. The copy-back operation according to the process of ①→④ may not accompany the error correction operation of data. Since the output of data from the nonvolatile memory device 120 to the outside is insignificant, the above-described copy-back is called "internal copy-back" (e.g. there is minimal utilization or potential for conflict with resources outside of the NVM 120).

During the external copy-back operation, the process of reading source data from the source area may be the same as that of the internal copy-back operation. However, during the external copy-back operation, the source data may be output outside of the nonvolatile memory device 120. The output source data may be processed by an error correction operation of the ECC block 114. The error-corrected source data may subsequently be transferred to the page buffer 123 of the nonvolatile memory device 120. The page buffer 123 programs the error-corrected source data in the destination area. Specifically, a copy-back way in which the source data moves along a path of ①→②→③→④ is called an "external copy-back".

Compared with the internal copy-back, the external copy-back further includes operations of inputting/outputting and buffering data and detecting and correcting an error of the data. Accordingly, when a plurality of pages are copied back by using the external copy-back method, the performance of the storage device 100 is reduced. However, the storage device 100 according to an embodiment of the inventive concept performs an inspection read (IR) operation when the number of error bits included in the source data is not less than the reference value TH. The inspection read operation is an operation for selecting a read voltage that allows the number of error bits included in the source data to be minimized. The optimum read voltage Vrd_opt, by which the minimum number of error bits is detected, may be detected by sampling a source area while varying a read voltage. When the number of error bits included in sampling data read by the optimum read voltage Vrd_opt is less than the reference value TH, then the internal copy-back is possible.

Accordingly, the inspection read operation according to an embodiment of the inventive concept may significantly reduce the probability that the external copy-back operation is performed, in the copy-back operation. This may mean that it is possible to prevent a decrease of performance due to the external copy-back operation in the copy-back operation.

Figure 5:
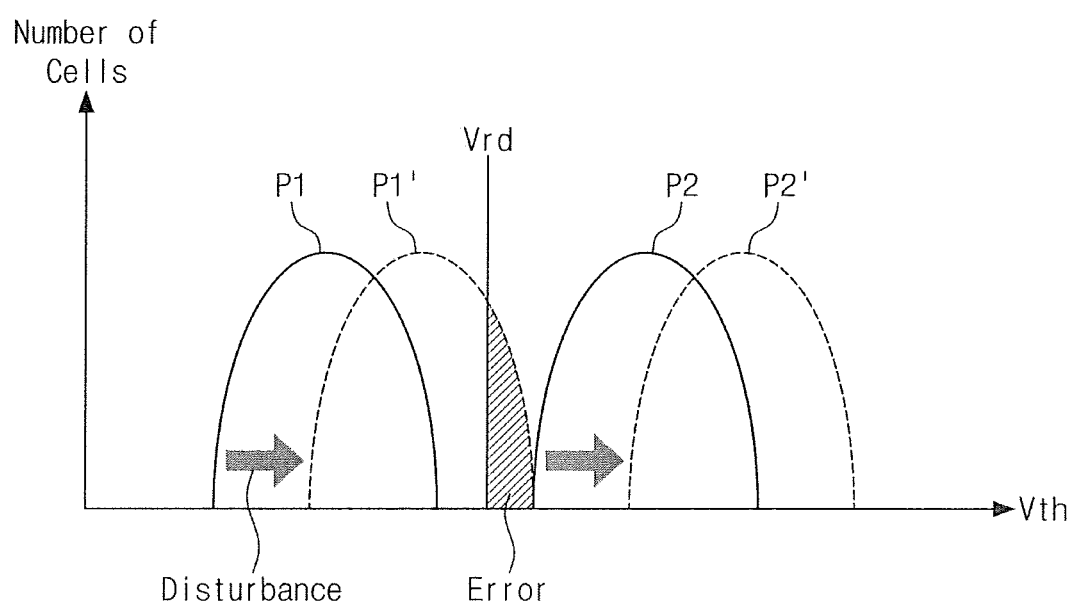
FIG. 5 is a graphical view of threshold distributions for a multi-state memory cell.

FIG. 5 is a graphical view of threshold distributions for a multi-state memory cell. FIG. 5 further illustrates a need to adjust a read voltage in accordance with an inspection read operation, according to an embodiment of the inventive concept. Referring to FIG. 5, it is assumed that initial program states of memory cells of a source area correspond to states P1 and P2. In this case, the read voltage Vrd for identifying each of the states P1 and P2 corresponds to a threshold voltage that corresponds to the middle of the states P1 and P2.

Threshold voltages of the memory cells in the source area may vary with a uniform directivity by read disturbance, various interferences, or a retention characteristic. For example, the states P1 and P2 of the memory cells may become higher than an initially programmed threshold voltage. The program states P1 and P2 of the memory cells may move to states P1' and P2' respectively by the increased threshold voltages. If the memory cells of the source area are read by using the read voltage Vrd, memory cells, each having a threshold voltage belonging to a slashed portion of the program state P1' may be detected as error bits. In this case, the external copy-back may be required.

However, errors may be significantly reduced by adjusting the read voltage Vrd in consideration of a shifting tendency of each of the threshold voltage (or program) states P1 and P2. Specifically, the number of error bits may be significantly reduced by sensing the source area by using the read voltage Vrd that is increased by a level commensurate with a movement of a threshold voltage distribution. The inspection read operation according to an embodiment of the inventive concept corresponds to a sampling operation for detecting an optimum value of the read voltage Vrd. Specifically, the inspection read operation according to an embodiment of the inventive concept is an operation of sampling the source area to detect a distribution valley of memory cells in the copy-back operation.

Figure 6:
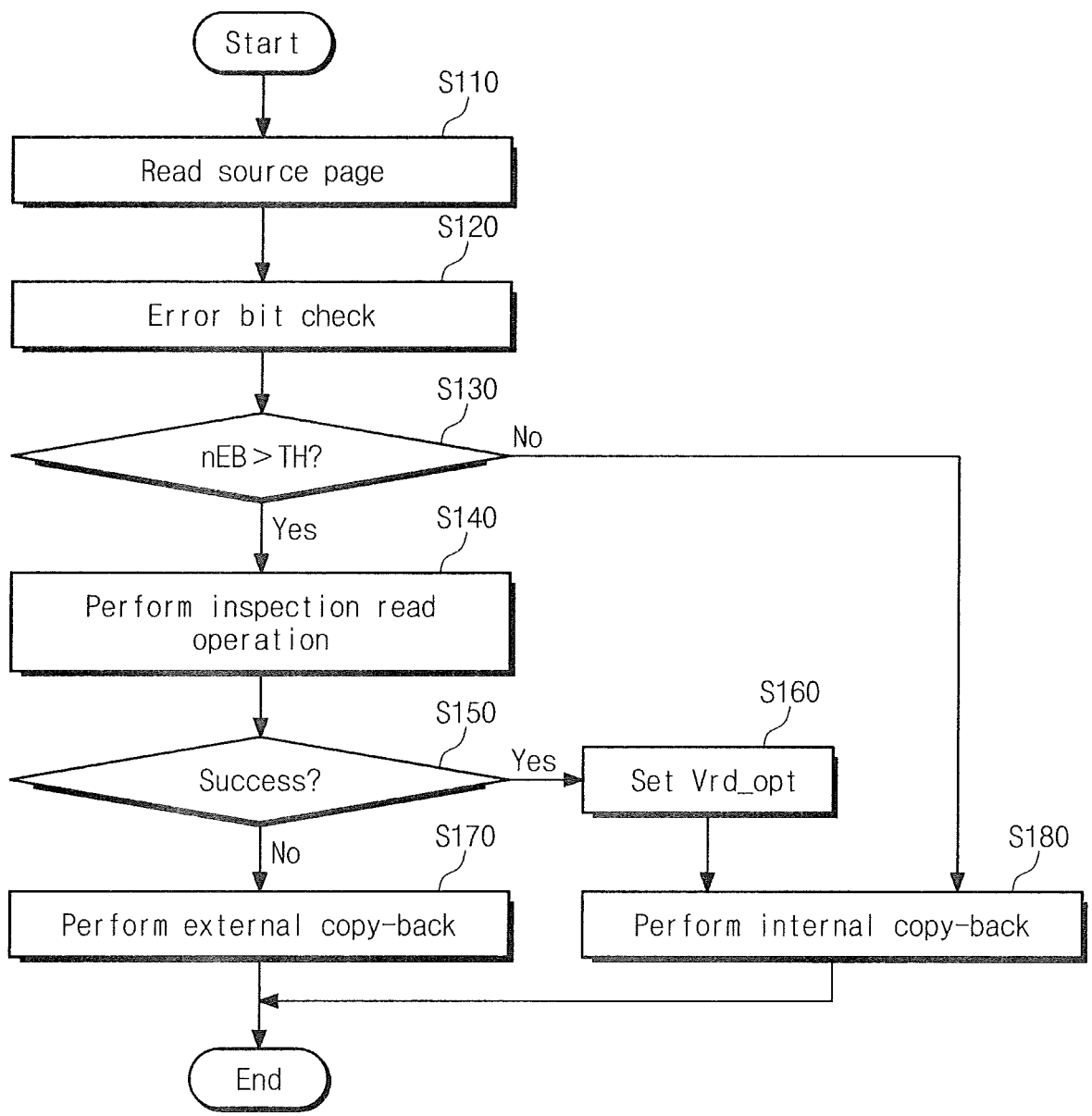
FIG. 6 is a flowchart representation of a copy-back method including an inspection read operation, in accordance with an embodiment of the present disclosure.

FIG. 6 is a flowchart representation of a copy-back method including an inspection read operation, in accordance with an embodiment of the present disclosure. A copy-back method of the storage device 100 (refer to FIG. 1) using an inspection read operation and a result of the inspection read operation will be briefly described with reference to FIG. 6. The procedure for copy-back starts when a copy-back operation on a specific area is requested by a garbage collection operation or various memory management operations.

When a copy-back request is received from a host, at operation S110, the storage device 100 may sense source data from a source area using a default read voltage Vrd as a read voltage for sensing memory cells of the source area.

At operation S120, the memory controller 110 may detect an error of the source data latched in the page buffer 123. The ECC block 114 may detect whether source data output from the page buffer 123 includes error bits and the number of error bits, in units of code words.

At operation S130, the memory controller 110 compares the number of error bits (nEB) with the reference value TH. If the number of error bits nEB existing in the source data is less than or equal to the reference value TH (e.g. the result of S130 is No), the process proceeds to operation S180. Specifically, the memory controller 110 may then perform the internal copy-back on the source data. If the number of error bits nEB existing in the source data is greater than the reference value TH (e.g. the result of S130 is Yes), the procedure proceeds to operation S140. Specifically, the memory controller 110 may then perform the inspection read operation on the source area.

At operation 140, the memory controller 110 may perform the inspection read operation for sensing a plurality of sampling data while changing a level of a read voltage. For example, the memory controller 110 may control the nonvolatile memory device 120 to perform a read operation by using a set of sampling read voltages SRi of different levels as a read voltage for identifying any one state. The memory controller 110 performs error detection on each of pieces of sampling data output by the sampling read voltages SRi. The memory controller 110 may determine a read voltage corresponding to sampling data, which has the minimum number of error bits, of the pieces of sampling data as the optimum read voltage Vrd_opt.

At operation S150, the memory controller 110 determines that the inspection read operation is successful, if the minimum number of error bits detected from the pieces of sampling data is not more than the reference value TH. In contrast, the memory controller 110 determines that the inspection read operation is not successful, if the minimum number of error bits detected from the pieces of sampling data is greater than the reference value TH. If the inspection read operation is determined as being successful, the procedure proceeds to operation S160. If the inspection read operation is determined as being not successful, the procedure proceeds to operation S170.

At operation S160, the memory controller 110 may set the optimum read voltage Vrd_opt, which is detected through the inspection read operation, as a read voltage for sensing the source area. In addition, the memory controller 110 may store a level of the optimum read voltage Vrd_opt detected through the inspection read operation in a specific memory provided in the memory controller 110 or the nonvolatile memory device 120.

At operation S170, since the number of error bits has not decreased to less than or equal to the reference value TH after performing the inspection read operation, the memory controller 110 may perform copy-back on the source area using the external copy-back method.

Specifically, the memory controller 110 may store the source data read from the source area in the buffer 112 and may perform an error correction operation by using the ECC block 114. The memory controller 110 then transfers the error correction completed source data from the buffer 112 to the nonvolatile memory device 120. The memory controller 110 may control the nonvolatile memory device 120 to program the source data input to the page buffer 123 in the destination area.

At operation S180, the memory controller 110 controls the nonvolatile memory device 120 to perform the internal copy-back operation on the source data. For example, when operation S180 is performed following operation S130, the nonvolatile memory device 120 may be controlled such that source data, which are maintained in the page buffer 123 after being sensed from the source area, are programmed in the destination area. In contrast, when operation S180 is performed following operation S160, the source area may be re-read by using the optimum read voltage Vrd_opt. The nonvolatile memory device 120 may be controlled such that the re-read source data is programmed in the destination area.

The copy-back method that accompanies the inspection read operation according to an embodiment of the inventive concept has been described. When the number of error bits is less than the reference value TH through the inspection read operation according to an embodiment of the inventive concept the internal copy-back operation is possible. When the threshold voltages of memory cells vary with the read disturbance or retention, the threshold voltages of the memory cells may increase or decrease in a uniform direction. A source area having an error of the above-described characteristic may be processed with the internal copy-back method through the inspection read operation. Accordingly, the probability that the external copy-back is executed in the copy-back operation accompanying the inspection read operation according to an embodiment of the inventive concept may be significantly reduced.

Figure 7:
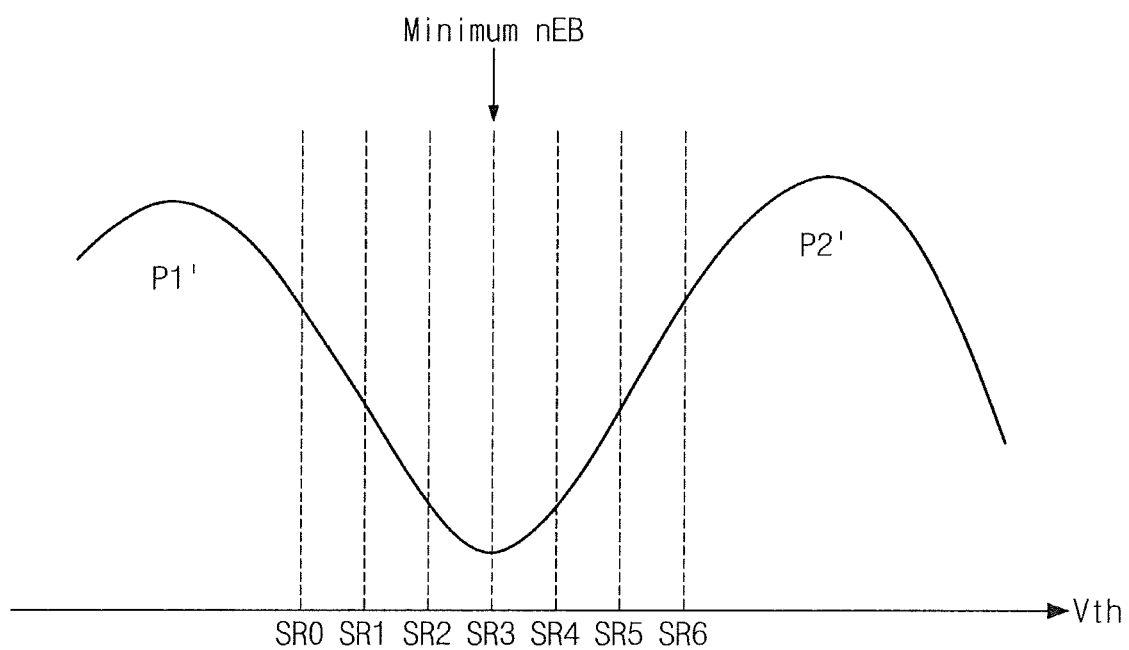
FIG. 7 is a graphical view of an inspection read operation in accordance with an embodiment of the present disclosure.

FIG. 7 is a graphical view of an inspection read operation in accordance with an embodiment of the inventive concept. An inspection read operation for distinguishing two states P1' and P2' of memory cells in a source area will be described with reference to FIG. 7. By detecting the number of error bits of data sensed by the inspection read operation using a plurality of sampling read voltages SRi, the optimum read voltage Vrd_opt may be selected.

First, the memory controller 110 may transfer the inspection read command IR CMD to the nonvolatile memory device 120. The inspection read command IR CMD provided to the nonvolatile memory device 120 may include an address of memory cells to be selected and level information of sampling read voltages SRi to be applied to the memory cells to be selected. In response to the inspection read command IR CMD, the nonvolatile memory device 120 reads memory cells of a source area by using sampling read voltages SR0, SR1, SR2, . . . , SRn−1, stores the read sampling data, and transfers the sampling data to the memory controller 110. Here, the sampling data may correspond to each of the sampling read voltages SR0, SR1, SR2, . . . , SRn−1. Specifically, sampling data SD0, SD1, SD2, . . . , SDn−1 may be transferred to the memory controller 110 as pieces of page data corresponding to the number of sampling read voltages.

The memory controller 110 detects the number of error bits of each of the pieces of sampling data SD0, SD1, SD2, . . . , SDn−1 that are respectively read by the sampling read voltages. Sampling data corresponding to the minimum number of error bits may be determined. In a distribution illustrated in FIG. 7, sampling data SD3, which is read by the sampling read voltage SR3, of the pieces of sampling data SD0, SD1, SD2, . . . , SDn−1 may correspond to the sample with the minimum number of error bits. The memory controller 110 may detect whether the number of error bits nEB of the sampling data SD3 exceeds the reference value TH. If the number of error bits nEB of the sampling data SD3 is not more than the reference value TH, the memory device 110 may control the nonvolatile memory device 120 to perform the internal copy-back using the sampling read voltage SR3. However, if the number of error bits nEB of the sampling data SD3 exceeds the reference value TH, the memory controller 110 may control the nonvolatile memory device 120 to perform the external copy-back operation.

Figure 8:
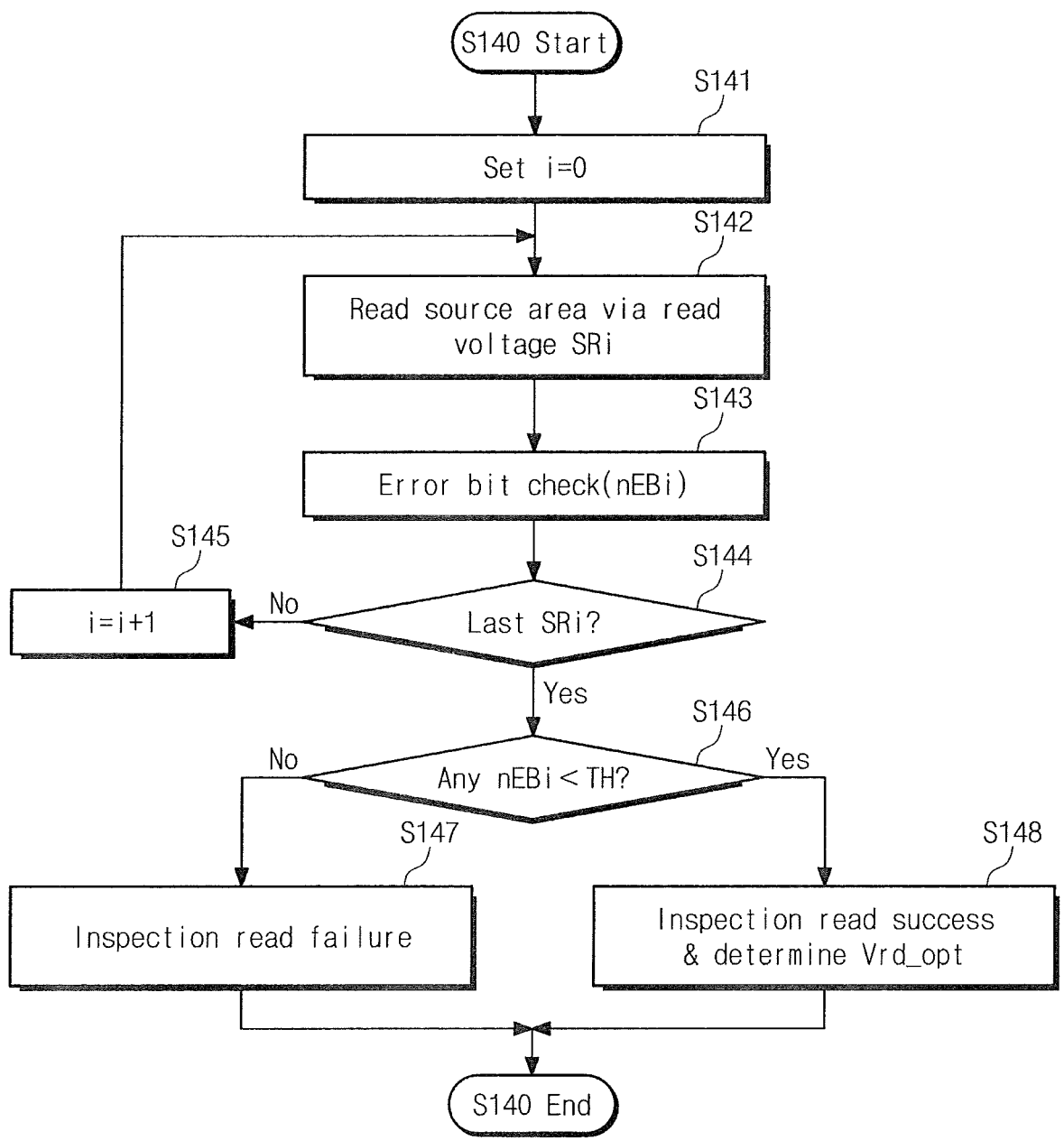
FIG. 8 is a flowchart representation of an inspection read operation in accordance with an embodiment of the present disclosure.

FIG. 8 is a flowchart representation of an inspection read operation in accordance with an embodiment of the present disclosure. Detail of the operation S140 of FIG. 6 corresponding to the inspection read operation will be described with reference to FIG. 8. If it is determined in operation S130 that the number of error bits nEB of source data exceeds the reference value TH, the inspection read operation according to an embodiment of the inventive concept starts.

At operation S141, the memory controller 110 resets a count "i" of the inspection read operation. Specifically, a sampling count of source data is reset in the inspection read operation.

At operation S142, the memory controller 110 may control the nonvolatile memory device 120 to sense a source area by using a sampling read voltage SRi corresponding to an inspection read count "i". In an initial count (i=0), the nonvolatile memory device 120 performs sensing and latching on a source area by using a set sampling read voltage SR0. The sensed data is called "sampling data SD0". The nonvolatile memory device 120 may transfer the sampling data SD0 to the memory controller 110.

At operation S143, the memory controller 110 may perform error detection on the sampling data SD0. In this case, the memory controller 110 may perform an error detection operation on the sampling data SD0. The number of error bits nEB0 included in the sampling data SD0 may be stored in a specific memory.

At operation S144, the memory controller 110 determines whether a current read count value "i" is a final count value of the inspection read operation. Specifically, whether the used sampling read voltage SRi is the last read voltage of the inspection read operation may be determined. It should be understood that the read count value "i" defining the number of sampling read operations performed in the inspection read operation is defined according to a memory characteristic with various values. If the current read count value "i" corresponds to the final sampling read operation (e.g., the result of S144 is Yes), the procedure proceeds to operation S146. If the current read count value "i" does not correspond to the final sampling read operation (e.g., the result of S144 is No), the procedure proceeds to operation S145.

At operation S145, the memory controller 110 increases the read count "i" (+1). Afterwards, the process returns to operation S142 for reading the source area by using the increased sampling read voltage.

At operation S146, whether at least one of the numbers of error bits nEBi respectively detected from pieces of sampling data SDi is less than the reference value TH may be detected. If the numbers of error bits nEBi respectively detected from pieces of sampling data SDi are not less than the reference value TH (e.g., the result of S146 is No), the procedure proceeds to operation S147. If at least one of the numbers of error bits nEBi respectively detected from pieces of sampling data SDi is less than the reference value TH (e.g., the result of S146 is Yes), the procedure proceeds to operation S148. In another embodiment, the operation S146 compares the number of error bits as being less than or equal to TH, rather than just less than TH, with similar effect.

At operation S147, the memory controller 110 determines that the inspection read operation on the source area is not successful. Specifically, the memory controller 110 may determine that the memory controller 110 fails to reduce the number of error bits to less than the reference value TH by only adjusting a read voltage.

At operation S148, the memory controller 110 determines that the inspection read operation on the source area is successful. Specifically, the memory controller 110 may determine that the memory controller 110 may reduce the number of error bits to less than the reference value TH through adjusting a read voltage. The memory controller 110 may determine the optimum read voltage Vrd_opt by using sampling read voltages. For example, a sampling read voltage, by which the minimum number of error bits is detected, may be determined as the optimum read voltage Vrd_opt.

Figure 9:
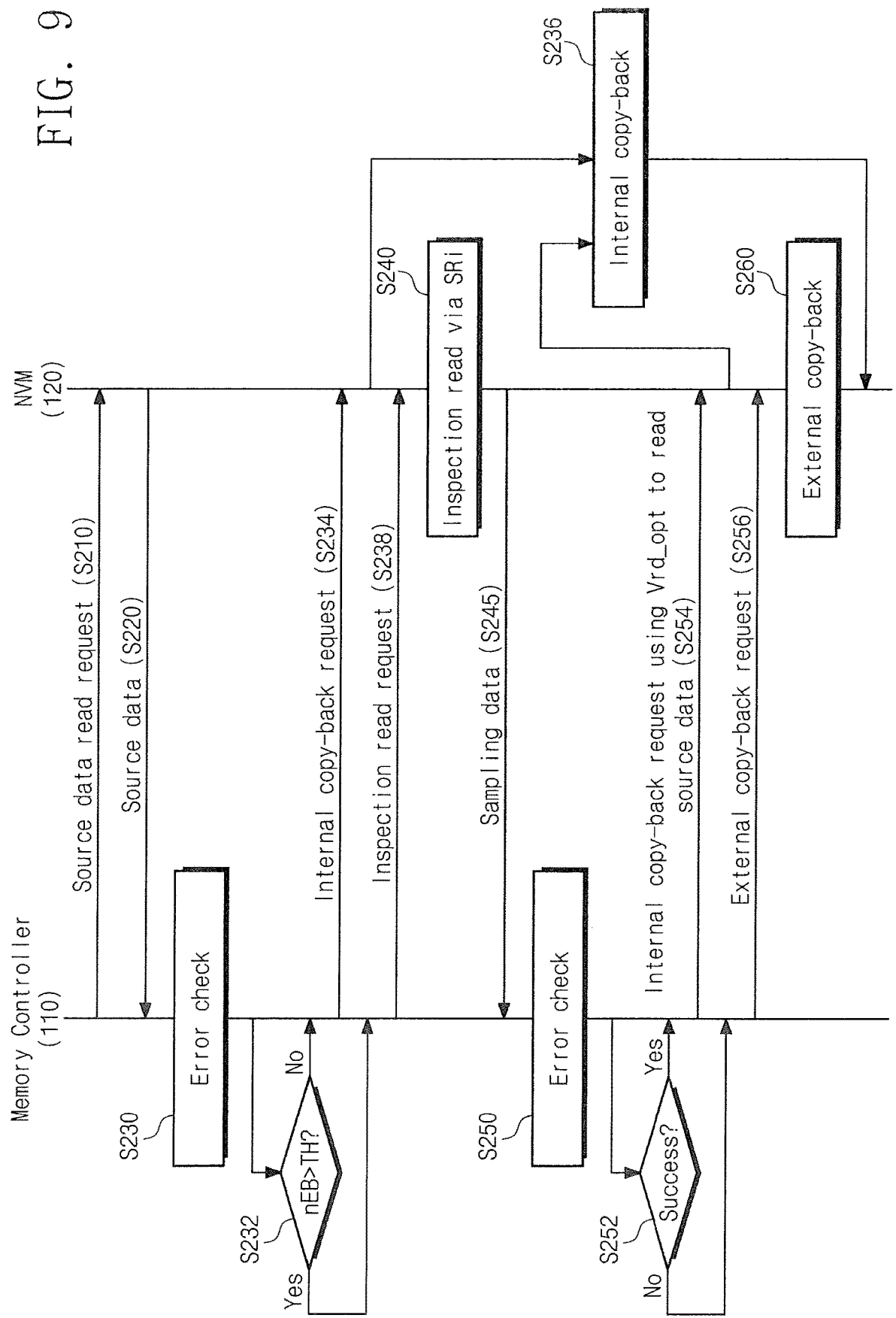
FIG. 9 is a flowchart representation of operations between a memory controller and a nonvolatile memory device of a storage device performing an inspection read operation in accordance with an embodiment of the present disclosure.

FIG. 9 is a flowchart representation of operations between the memory controller 110 and the nonvolatile memory device 120 of the storage device 100 performing an inspection read operation in accordance with an embodiment of the present disclosure. Referring to FIG. 9, if a copy-back operation of memory management operations including a garbage collection operation is requested, a request of reading a source area by the memory controller 110 starts.

At operation S210, the memory controller 110 transfers a request of reading source data to the nonvolatile memory device 120. For example, the memory controller 110 may provide the nonvolatile memory device 120 with a read command for a copy-back operation on the source area.

At operation S220, the nonvolatile memory device 120 reads data stored in the source area in response to the read command and transfers the read data to the memory controller 110. To this end, the nonvolatile memory device 120 may perform sensing and latching on memory cells of the source area by using an initialized read voltage or a default read voltage Vrd. The nonvolatile memory device 120 may output source data latched in the page buffer 123 to the memory controller 110.

At step S230, the memory controller 110 may perform an error check on the source data transferred from the nonvolatile memory device 120. The memory controller 110 may detect whether the source data includes an error, in units of "codewords" by using the ECC block 114. Also, the memory controller 110 may count the number of error bits thus detected.

At operation S232, the memory controller 110 compares the number of error bits nEB detected from the source data with the reference value TH. The memory controller 110 determines whether to perform the internal copy-back or the inspection read operation, based on the result of comparing the number of error bits nEB and the reference value TH. If the number of error bits nEB of the source data is not more than the reference value TH, the memory controller 110 selects the internal copy-back method. If the number of error bits nEB of the source data exceeds the reference value TH, the memory controller 110 selects the inspection read operation.

At operation S234, the memory controller 110 may request the nonvolatile memory device 120 to perform the internal copy-back. At operation S236, the nonvolatile memory device 120 performs the internal copy-back, in which the source data retained in the page buffer 123 is programmed in a destination area.

At operation S238, the memory controller 110 may request the inspection read operation from the nonvolatile memory device 120. At operation S240, the nonvolatile memory device 120 performs the inspection read operation on the source area while varying the sampling read voltage SRi. At operation S245, the nonvolatile memory device 120 may provide pieces of sampling data latched as the sampling read result to the memory controller 110.

At operation S250, the memory controller 110 may perform error check on pieces of sampling data that are provided from the nonvolatile memory device 120 as a result of the inspection read operation. The memory controller 110 may detect the number of error bits from each of the pieces of sampling data by using the ECC block 114.

At operation S252, the memory controller 110 determines whether the inspection read operation is successful. The memory controller 110 may detect whether the number of error bits of sampling data, of which the number of error bits is the smallest, of the pieces of sampling data exceeds the reference value TH. If the minimum number of error bits nEB_min is not more than the reference value TH, the memory controller 110 determines that the inspection read operation is successful (e.g., the result of S252 is Yes). If the minimum number of error bits nEB_min exceeds the reference value TH, the memory controller 110 determines that the inspection read operation is not successful (e.g., the result of S252 is No).

At operation S254, the memory controller 110 may set and store a sampling read voltage corresponding to the minimum number of error bits nEB_min as the optimum read voltage Vrd_opt for the source area. The memory controller 110 may request the nonvolatile memory device 120 to perform the internal copy-back operation using the optimum read voltage Vrd_opt. In response to the request, the nonvolatile memory device 120 may sense the source area by using the optimum read voltage Vrd_opt and may directly program source data read from the source area in the destination area without outputting the read source data to the outside.

At operation S256, the memory controller 110 may request the external copy-back operation, in which an error correction function of the ECC block 114 is used, from the nonvolatile memory device 120.

At operation S260, the storage device 100 may perform the external copy-back operation. Specifically, the nonvolatile memory device 120 reads source data and transfers the read source data to the memory controller 110. The memory controller 110 performs an error correction operation after storing the source data in the buffer 112. The error correction completed source data may be programmed in the destination area after being transferred to the nonvolatile memory device 120 again.

Figure 10:
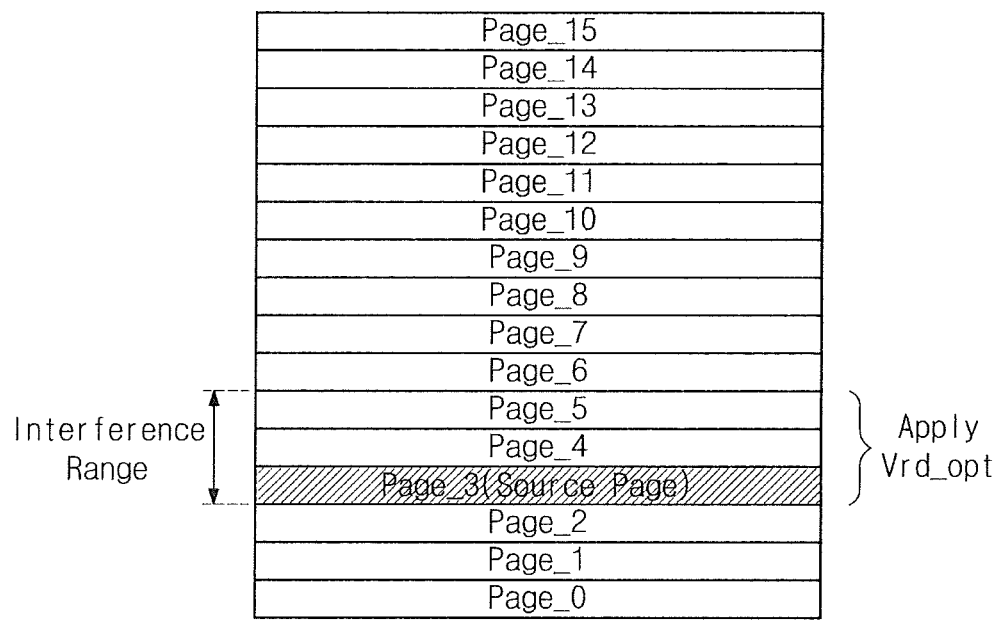
FIG. 10 is a functional block diagram describing one way to apply a result of an inspection read operation, in accordance with an embodiment of the present disclosure.

FIG. 10 is a functional block diagram describing one way to apply a result of an inspection read operation, in accordance with an embodiment of the present disclosure. Referring to FIG. 10, if the optimum read voltage Vrd_opt is determined as a result of the inspection read operation on a source area (e.g., a page), the internal copy-back, in which the optimum read voltage Vrd_opt is applied to peripheral areas of the source area, can be performed.

In the example shown in FIG. 10 if the copy-back operation is performed on a memory block including 16 pages, the inspection read operation is first performed on a source area Page_3. In this case, the optimum read voltage Vrd_opt for the source area Page_3 may be determined. However, a page Page_4 adjacent to the source area Page_3 may be viewed as threshold voltages of memory cells of the page Page_4 are shifted due to a factor substantially similar to that of the source area Page_3. In this case, resources and time are needed to perform the inspection read operation in the copy-back operation on the adjacent page Page_4, which may otherwise be avoided with the present disclosure.

According to an embodiment of the inventive concept, a result of the inspection read operation of the source area Page_3 may be equally applied to areas that are adjacent to the source area Page_3, from which the inspection read operation starts, within a given range. Specifically, the optimum read voltage Vrd_opt that is selected as a result of the inspection read operation of the source area Page_3 may be used as a read voltage for the copy-back operation of adjacent pages Page_4 and Page_5. A range, in which the optimum read voltage Vrd_opt is applied, may be limited to an interference range in an access operation such as a program operation or a read operation. For example, in the case where a memory block is programmed with scrambled locations, a range in which the optimum read voltage Vrd_opt is applied, may be determined according to a scramble sequence. However, it should be appreciated that the range is selected according to various criteria or needs without being limited to the above-described examples.

Figure 11:
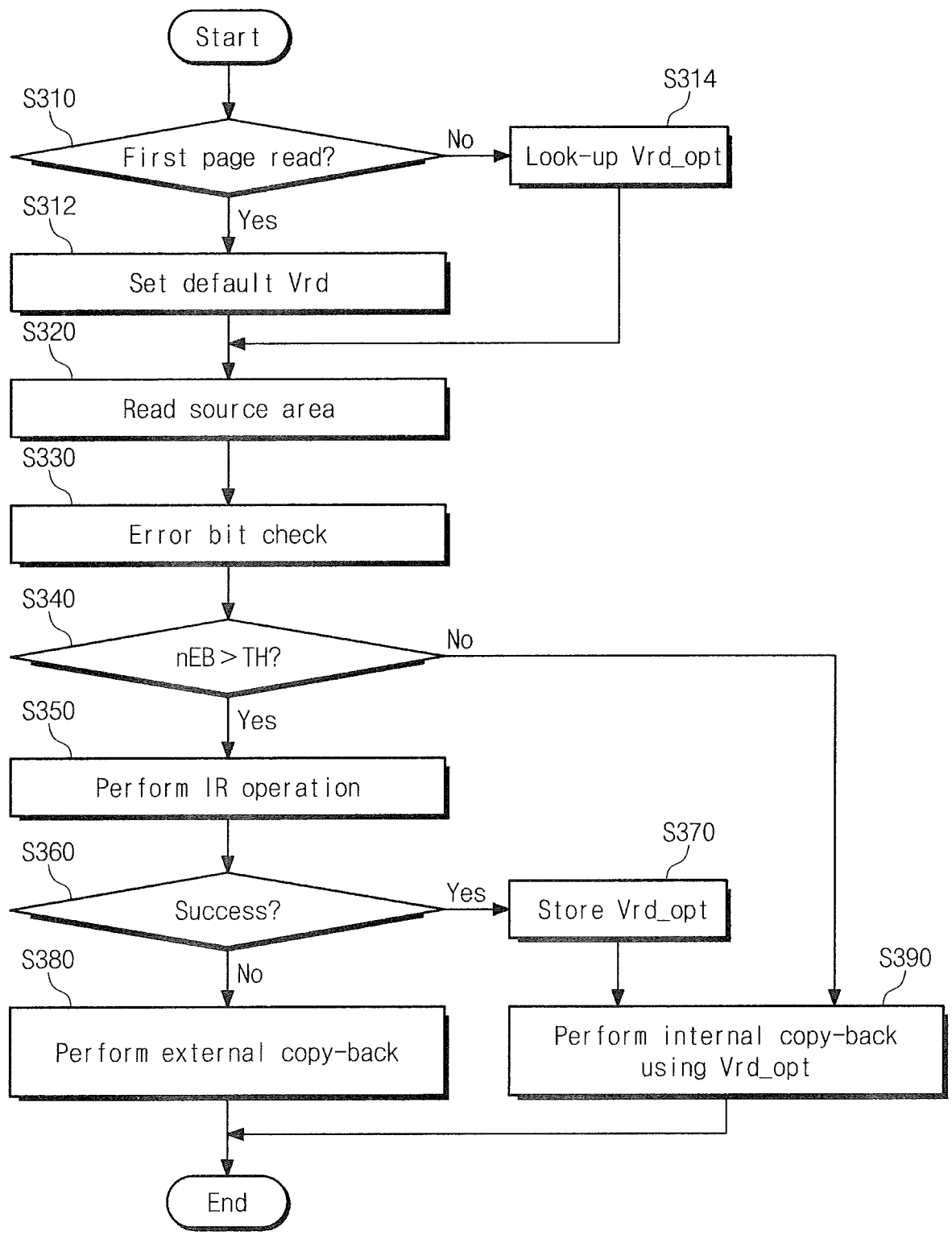
FIG. 11 is a flowchart representation of a copy-back method in which an optimum read voltage of FIG. 10 is applied to other source areas, in accordance with another embodiment of the present disclosure.

FIG. 11 is a flowchart representation of a copy-back method in which an optimum read voltage of FIG. 10 is applied to other source areas, in accordance with another embodiment of the present disclosure. A copy-back method of the storage device 100 (refer to FIG. 1) using an inspection read operation and a result of the inspection read operation will be briefly described with reference to FIG. 11.

At operation S310, the storage device 100 determines whether a source area of a current copy-back target is associated with a first source area (e.g., page) of pieces of data to be copied back. If the source area of the current copy-back target is associated with first copy-back (e.g., the result of S310 is Yes), the procedure proceeds to operation S312. In contrast, if the source area of the current copy-back target is continuous with a previously copied back source area (e.g., the result of S310 is No), the procedure proceeds to operation S314. At operation S312, the storage device 100 may set a read voltage for reading a source area of the current copy-back target to the default read voltage Vrd. At operation S314, the storage device 100 may determine whether there is the optimum read voltage Vrd_opt detected in a previous inspection read operation as a read voltage for reading the source area of the current copy-back target. If the optimum read voltage Vrd_opt exists, the storage device 100 may set the nonvolatile memory device 120 such that the nonvolatile memory device 120 reads the source area by using the optimum read voltage Vrd_opt. If the optimum read voltage Vrd_opt does not exist because the inspection read operation is not previously performed, the storage device 100 may set the nonvolatile memory device 120 such that the nonvolatile memory device 120 reads the source area by using the default read voltage Vrd.

At operation S320, the storage device 100 may perform a read operation on the source area by using the determined read voltage. Operation S330 to operation S390 are substantially the same as operation S120 to operation S180 of FIG. 6, and a description thereof is thus omitted. According to the above-described copy-back method, if the optimum read voltage is selected through a previous inspection read operation, the selected optimum read voltage may be used to read source data upon copying back any other source area adjacent to the source area of the current copy-back target.

Figure 12:
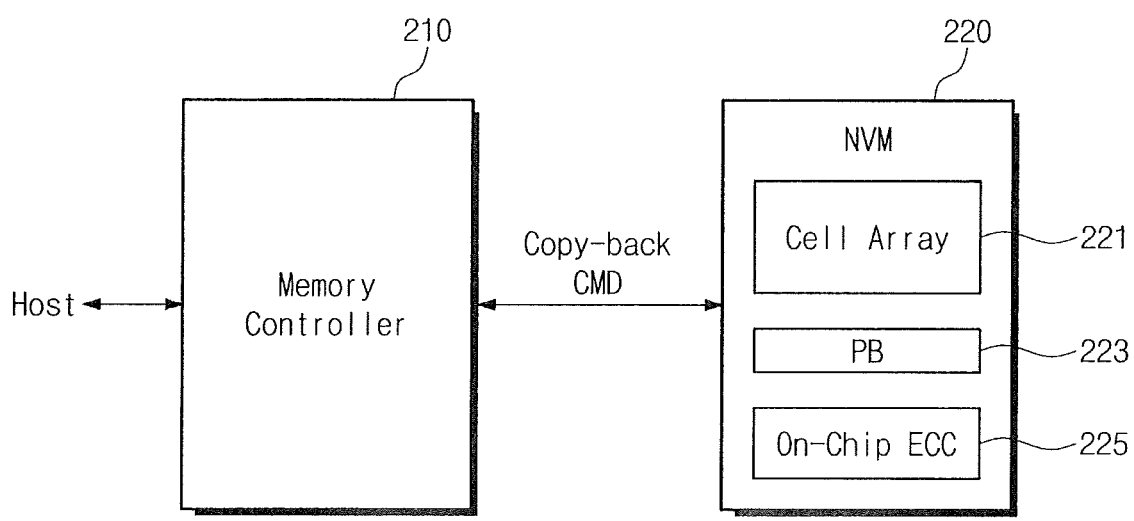
FIG. 12 is a functional block diagram describing a memory system, in accordance with another embodiment of the present disclosure.

FIG. 12 is a functional block diagram describing a memory system, in accordance with another embodiment of the present disclosure. Referring to FIG. 12, a memory system 200 may include a memory controller 210 and a nonvolatile memory device 220. Here, the nonvolatile memory device 220 includes an on-chip ECC 225. Accordingly, detection of error bits may be made by the on-chip ECC 225 in the nonvolatile memory device 220 upon performing the inspection read operation in the copy-back operation.

The memory controller 210 may provide a command for the copy-back operation to the nonvolatile memory device 220. When it is determined in the copy-back operation that the number of error bits of source data exceeds the reference value TH, the memory controller 210 may provide an inspection read command to the nonvolatile memory device 220.

The nonvolatile memory device 220 may read memory cells of a source area by using a plurality of sampling read voltages SRi in response to the inspection read command. The nonvolatile memory device 220 may perform error bit detection on pieces of read sampling data. Sampling data, of which the number of error bits is less than the reference value TH, may be programmed in a destination area of a cell array 221.

Figure 13:
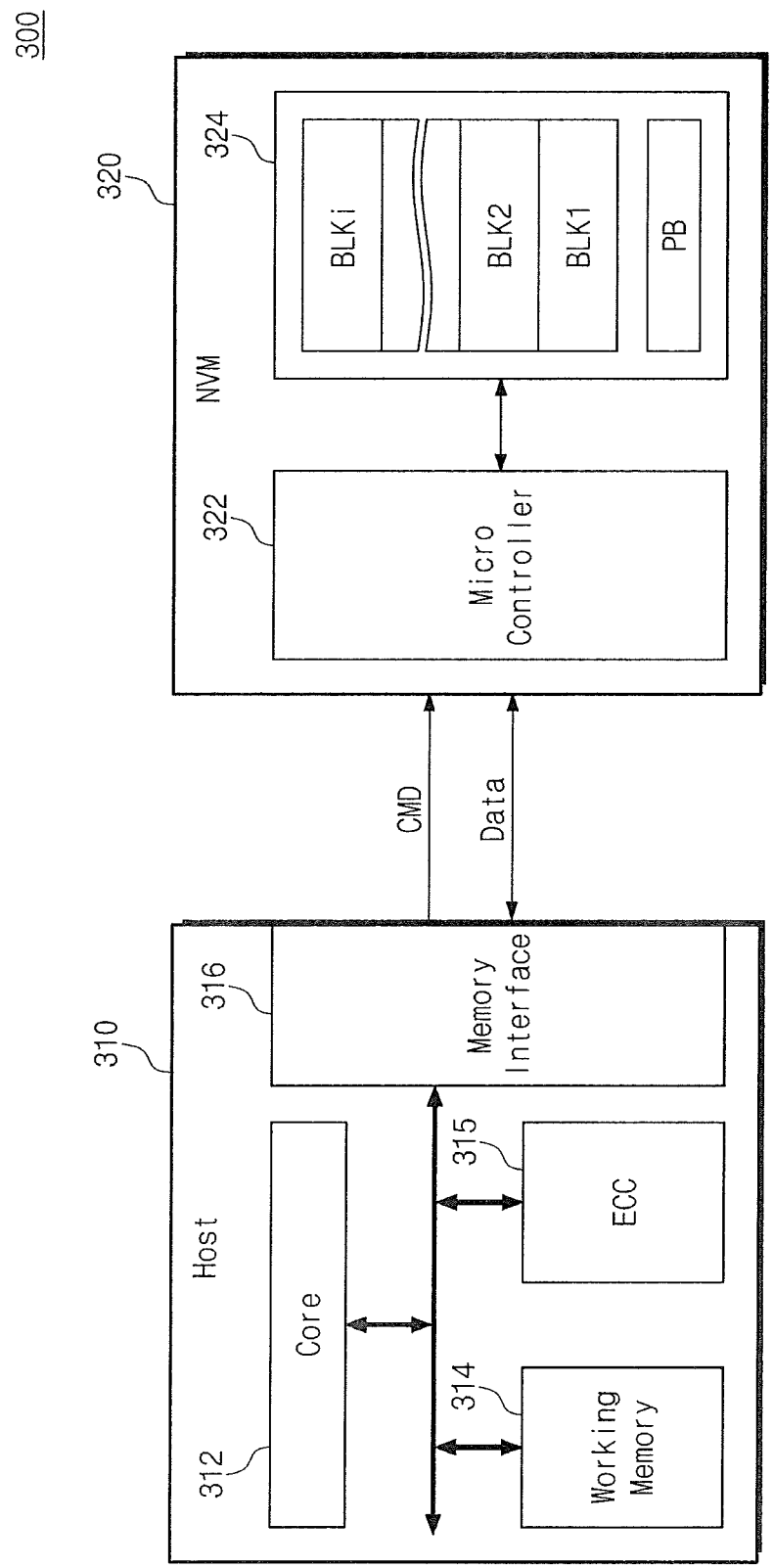
FIG. 13 is a functional block diagram describing a user system, in accordance with another embodiment of the present disclosure.

FIG. 13 is a functional block diagram describing a user system, in accordance with another embodiment of the present disclosure. Referring to FIG. 13, a user system 300 may include a host 310 and a storage device 320. The host 310 may include a core 312, a working memory 314, an ECC block 315, and a memory interface 316. The storage device 320 may include a micro-controller 322 and a nonvolatile memory device 324. Here, the storage device 320 may be implemented with a perfect page new (PPN) device.

The core 312 of the host 310 may execute various application programs loaded in the working memory 314 or may process data loaded into the working memory 314. Software such as an operating system and an application program may be loaded into the working memory 314. In particular, a copy-back algorithm including the inspection read operation according to an embodiment of the inventive concept or software modules may be loaded in an operating system that is loaded into the working memory 314.

The memory interface 316 may convert a memory address access-requested by the core 312 into a physical address. The memory interface 316 may perform, for example, a function of a flash translation layer (FTL).

The storage device 320 may include the micro-controller 322 and the nonvolatile memory device 324. The micro-controller 322 may provide the nonvolatile memory device 324 with an inspection read command IR CMD, an address ADDR, control signals CTRLs, and data that are provided from the host 310. The storage device 320 may provide the host 310 with a cell count for a requested voltage range in response to the inspection read command IR CMD.

According to an embodiment of the inventive concept, performance of a storage device may be improved by significantly lowering the probability that an external copy-back, in which data is output outside of the memory, is performed.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:

1. A copy-back method of a nonvolatile memory device comprising:
    reading source data from a source area of the nonvolatile memory;
    detecting a number of error bits of the source data;
    performing an inspection read operation when the number of error bits of the source data exceeds a reference value, the inspection read operation including reading a plurality of read sampling data from the source area and detecting the number of error bits of each of the read sampling data, wherein each of the plurality of read sampling data being read uses a corresponding sampling read voltage of a plurality of sampling read voltages; and
    determining, based on the inspection read operation, whether (a) to copy back the source data to a destination area using an internal copy-back method which does not comprise an error correction operation, or (b) to copy back the source data using an external copy-back method which comprises an error correction operation,
    wherein the internal copy-back method is determined to be used when a number of detected error bits of the read sampling data is not more than the reference value.

2. The method of claim 1, wherein performing the inspection read operation, includes detecting optimum sampling data from the read sampling data wherein the optimum sampling data has a least number of detected error bits of each of the read sampling data.

3. The method of claim 2, wherein the sampling read voltage used to read the optimum sampling data is selected as an optimum read voltage for re-reading the source data from the source area prior to the internal copy-back method.

4. The method of claim 1, comprising selecting the external copy-back method when each of the read sampling data has a detected number of error bits exceeding the reference value.

5. The method of claim 1, wherein detecting the number of error bits is performed in a memory controller connected to the nonvolatile memory device.

6. The method of claim 5, wherein when the external copy-back method is used, the source data is stored in a buffer of the memory controller, wherein at least one error bit of the source data is corrected.

7. The method of claim 1, wherein performing the inspection read operation includes detecting an optimum read voltage and the optimum read voltage being stored in a working memory.

8. The method of claim 7, wherein the optimum read voltage is used to re-read source data from the source area prior to a copy-back of the source data in a memory area that is within a specific physical distance from the source area.

9. A storage device comprising:

a nonvolatile memory device configured to sense source data from a source area of the storage device, to store the source data in a page buffer, and to write the source data stored in the page buffer to a destination area in response to a command; and a memory controller configured to detect a number of error bits of the source data and, when the number of error bits of the source data exceeds a reference value, to perform an inspection read operation on a plurality of read sampling data in the source area to determine if a number of error bits detected for each of the plurality of the read sampling data exceeds the reference value during a copy-back operation, wherein the inspection read operation includes reading each of the plurality of the read sampling data from the source area by using a respective sampling read voltage and detecting the number of error bits for each of the read sampling data.

10. The storage device of claim 9, wherein when the number of error bits of the source data is not more than the reference value, the memory controller controls the nonvolatile memory device to write the source data to the destination area without an error correction operation on the source data.

11. The storage device of claim 9, wherein the memory controller controls the nonvolatile memory device to re-read the source data of the source area by using a sampling read voltage determined from the read sampling data during the inspection read operation to have a number of error bits being not more than the reference value.

12. The storage device of claim 11, wherein the memory controller controls the nonvolatile memory device to program the source data that is re-read into the destination area without transmitting the source data to a device other than the nonvolatile memory device.

13. The storage device of claim 11, wherein the sampling read voltage determined from the read sampling data during the inspection read operation to have a number of error bits being not more than the reference value, is used as the sampling read voltage used to re-read source data from the source area prior to a a copy-back operation of an area adjacent to the source area.

14. The storage device of claim 13, wherein when each of the read sampling data has a respective number of error bits being more than the reference value, the memory controller performs an error correction operation on the source data and programs the error-corrected source data in the destination area of the nonvolatile memory device.

15. The storage device of claim 9, wherein the sampling read voltages have read levels configured for detecting a distribution valley of memory cells in the source area.

16. A copy-back method of a storage device comprising:
reading memory data from a source area of the storage device;
determining a number of error bits of the memory data;
performing an inspection read operation if the number of error bits exceeds a reference value; and
writing the memory data to a destination area of the storage device if the number of error bits does not exceed the reference value.

17. The method of claim 16 wherein performing the inspection read operation comprises reading a sampled memory data with a plurality of read voltages to determine an optimized read voltage wherein the number of error bits is minimized.

18. The method of claim 16 further comprising re-reading the memory data with an optimized read voltage determined from the inspection read operation, and writing the memory data, read with the optimized read voltage, to the destination area if the number of error bits is less than or equal to the reference value.

19. The method of claim 16 further comprising re-reading the memory data with an optimized read voltage determined from the inspection read operation, and performing an error correction on the memory data read with the optimized read voltage, before writing the memory data to the destination area, if the number of error bits of the memory data is greater than the reference value.

20. The method of claim 16 further comprising reading a second memory data, proximal to the memory data, with an optimized read voltage determined from the inspection operation.

* * * * *